United States Patent
Kim et al.

(10) Patent No.: US 8,846,305 B2
(45) Date of Patent: Sep. 30, 2014

(54) PHOTOLITHOGRAPHY METHOD INCLUDING DUAL DEVELOPMENT PROCESS

(75) Inventors: Eunsung Kim, Seoul (KR); Kyoungseon Kim, Suwon-si (KR); Jaewoo Nam, Seoul (KR); Chulho Shin, Yongin-si (KR); Shiyong Yi, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 37 days.

(21) Appl. No.: 13/537,618

(22) Filed: Jun. 29, 2012

(65) Prior Publication Data
US 2013/0095433 A1   Apr. 18, 2013

(30) Foreign Application Priority Data
Oct. 17, 2011   (KR) ........................ 10-2011-0106014

(51) Int. Cl.
*G03F 7/26* (2006.01)
*G03F 7/20* (2006.01)

(52) U.S. Cl.
CPC ............... *G03F 7/20* (2013.01); *G03F 7/2028* (2013.01)
USPC ........................................................ 430/322

(58) Field of Classification Search
USPC ........................................ 430/311, 322, 330
See application file for complete search history.

(56) References Cited

U.S. PATENT DOCUMENTS

| 7,786,012 | B2 | 8/2010 | Miller | |
|---|---|---|---|---|
| 7,820,550 | B2 | 10/2010 | Nyhus et al. | |
| 2003/0190534 | A1* | 10/2003 | Kobayashi et al. | 430/5 |
| 2008/0284989 | A1* | 11/2008 | Ono et al. | 355/27 |
| 2010/0055625 | A1 | 3/2010 | Gronheid et al. | |

FOREIGN PATENT DOCUMENTS

KR   1020070071613   7/2007

* cited by examiner

*Primary Examiner* — Kathleen Duda
(74) *Attorney, Agent, or Firm* — F. Chau & Associates, LLC

(57) ABSTRACT

A photolithography method includes coating a photoresist on an active region and an edge region of a wafer, exposing the photoresist on the edge region to first ultraviolet rays, exposing the photoresist on the active region to second ultraviolet rays, depositing a first developing solution on the photoresist on the edge region to remove the photoresist on the edge region, and developing the photoresist on the active region using a second developing solution.

20 Claims, 8 Drawing Sheets

PHOTOLITHOGRAPHY METHOD INCLUDING DUAL DEVELOPMENT PROCESS

CROSS-REFERENCE TO RELATED APPLICATIONS

This application claims priority under 35 U.S.C. §119 to Korean Patent Application No. 10-2011-0106014, filed on Oct. 17, 2011, the disclosure of which is incorporated by reference herein in its entirety.

TECHNICAL FIELD

Exemplary embodiments of the inventive concept relate to a method of manufacturing a semiconductor device and, more particularly, to a photolithography method including a dual development process utilizing a positive tone development process and a negative tone development process.

DISCUSSION OF THE RELATED ART

A photolithography process includes forming a photoresist pattern on a semiconductor wafer or a processing layer. The photolithography process is performed before an etching process or an ion implantation process is performed. A photolithography process may include, for example, a photoresist coating process, an exposure process, and a development process. During the exposure process, a photoresist may be exposed to an incident light passing through a photo mask. The exposure process may determine a size of a fine pattern according to a wavelength of the incident light irradiated to the photoresist. The development process may include a positive tone development process that removes the photoresist exposed to the incident light, and a negative tone development process that removes the photoresist that is not exposed to the incident light.

SUMMARY

Exemplary embodiments of the inventive concept provide a photolithography process capable of preventing or reducing photoresist defects, such as in an edge region of a wafer.

According to an exemplary embodiment of the inventive concept, a photolithography method may include coating a photoresist on a wafer having an active region and an edge region, exposing the photoresist on the edge region to ultraviolet rays, exposing the photoresist on the active region to the ultraviolet rays, removing the photoresist on the edge region by selectively providing a first developing solution to the photoresist on the edge region, and developing the photoresist on the active region by a second developing solution.

In an exemplary embodiment, the photoresist may include a chemical amplification type photoresist. The chemical amplification type photoresist may include a positive photoresist.

In an exemplary embodiment, the first developing solution may be sprayed on the photoresist on the edge region. The first developing solution may include an alkali solution. The alkali solution may include an aqueous solution having a tetramethylammonium hydroxide (TMAH).

In an exemplary embodiment, developing the photoresist on the active region may include soaking the wafer in the second developing solution. The second developing solution may include an organic acid solution. The organic acid solution may include normal butyl acetylene.

In an exemplary embodiment, the photolithography method may further include removing the photoresist on a side of the wafer before exposing the photoresist on the edge region to the first ultraviolet rays.

According to an exemplary embodiment of the inventive concept, a photolithography method includes coating a photoresist on an active region and an edge region of a wafer, exposing the photoresist on the edge region to first ultraviolet rays, performing a positive tone development process on the photoresist on the edge region, exposing the photoresist on the active region to second ultraviolet rays, and performing a negative tone development process on the photoresist on the active region.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION OF THE EXEMPLARY EMBODIMENTS

Figure 1:
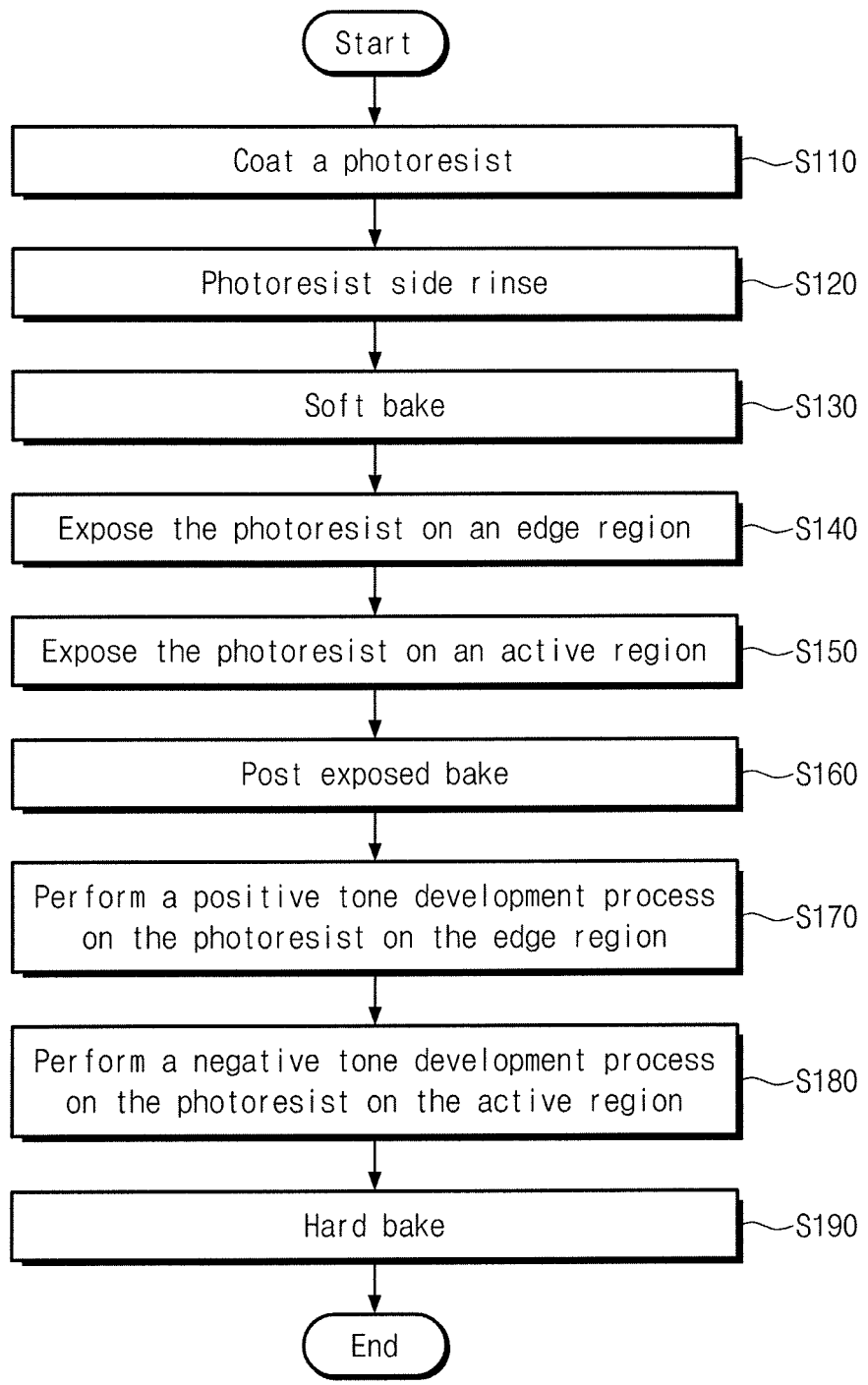
FIG. 1 is a flowchart illustrating a photolithography method, according to an exemplary embodiment of the inventive concept.

Exemplary embodiments of the inventive concept will now be described more fully hereinafter with reference to the accompanying drawings, in which like reference numerals may refer to like elements throughout the accompanying drawings.

It will be understood that when an element such as a layer, region or substrate is referred to as being "on" another element, it can be directly on the other element or intervening elements may be present.

Figure 2:
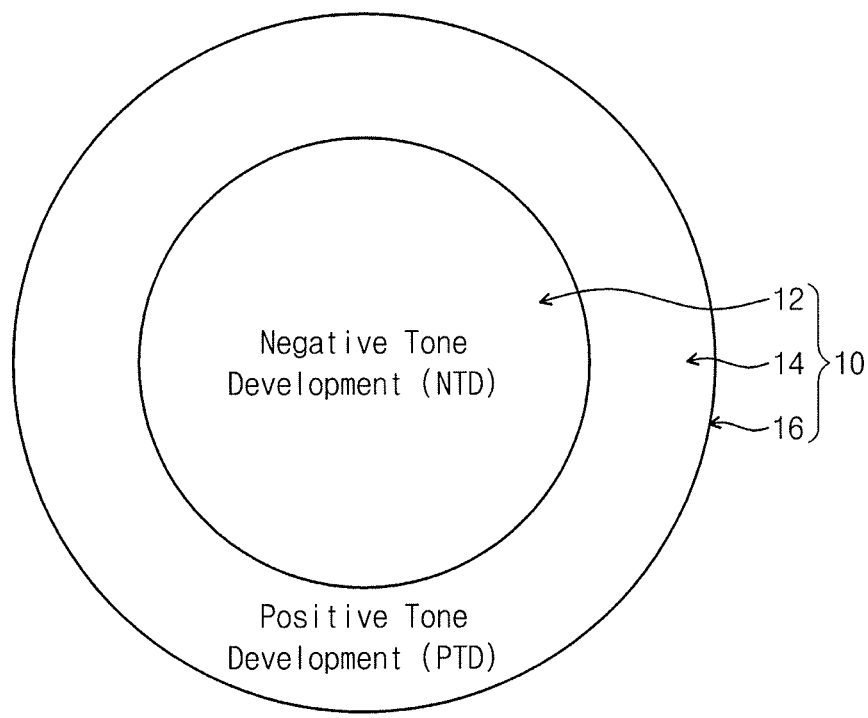
FIG. 2 is a plan view of a wafer illustrating a dual development process of a photolithography method of FIG. 1, according to an exemplary embodiment of the inventive concept.

FIG. 1 is a flowchart illustrating a photolithography method, according to an exemplary embodiment of the inventive concept. FIG. 2 is a plan view of a wafer illustrating a dual development process of a photolithography method of FIG. according to an exemplary embodiment of the inventive concept.

Referring to FIGS. 1 and 2, a photolithography method according to an exemplary embodiment of the inventive concept includes performing a positive tone development (PTD) process on a photoresist disposed on an edge region 14 (S170), and performing a negative tone development (NTD) process on the photoresist disposed on an active region 12

(S180). The positive tone development (PTD) process and the negative tone development (NTD) process may be sequentially performed. Any potential residual defects of the photoresist in the edge region 14 may be prevented or reduced as a result of utilizing the positive tone development (PTD) process and the negative tone development (NTD) process.

Hereinafter, the photolithography process including a dual development process will be described in more detail.

FIGS. 3 to 9 are cross-sectional views sequentially illustrating a photolithography method of FIG. 1, according to an exemplary embodiment of the inventive concept.

Figure 3:
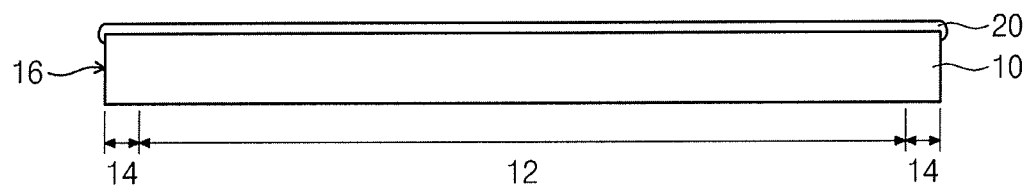
FIGS. 3 to 9 are cross-sectional views sequentially illustrating a photolithography method of FIG. 1, according to an exemplary embodiment of the inventive concept.

Referring to FIGS. 1 to 3, in the photolithography method according to an exemplary embodiment of the inventive concept, a photoresist 20 may be coated on a surface of a wafer 10 (S110). The photoresist 20 may be coated on an entire surface of the wafer 10. The wafer 10 may include an active region 12 corresponding to a net die or a pattern region, an edge region 14 surrounding the active region 12, and a side 16 corresponding to the outermost portion of the edge region 14. The photoresist 20 may be uniformly coated on the entire surface of the wafer 10 using, for example, a spin coating method. The photoresist 20 may also be coated on the side 16 of the wafer 10. The photoresist 20 may include a chemical amplification type photoresist. Additionally, the chemical amplification type photoresist may include a positive photoresist.

Figure 4:
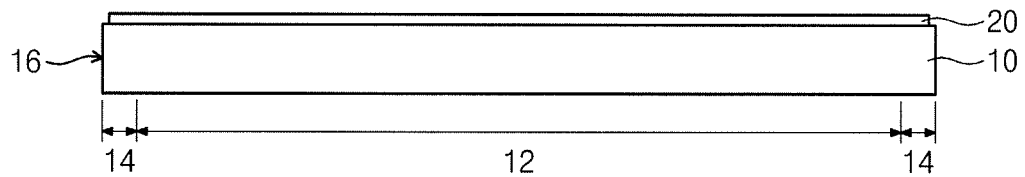

Referring to FIGS. 1 and 4, the photoresist 20 on the side wall 16 of the wafer 10 is removed (S120), and the photoresist 20 is heated by a soft bake process (S130). The photoresist 20 on the side wall 16 may be removed, for example, by a solvent or a thinner sprayed on the side wall 16. This process may be referred to as a side rinse process. The side rinse process may correspond to an edge rinse process. The side rinse process performed on the photoresist 20 may remove the photoresist 20 disposed in an area extending from the outermost portion of the wafer 10 inward to about 0.5 mm. The soft bake process of the photoresist 20 may be performed at a temperature within a range of about 110 degrees Celsius to about 120 degrees Celsius, resulting in a process time within a range of about one minute to about five minutes. The soft bake process may improve hardness and adhesion of the photoresist 20.

Figure 5:
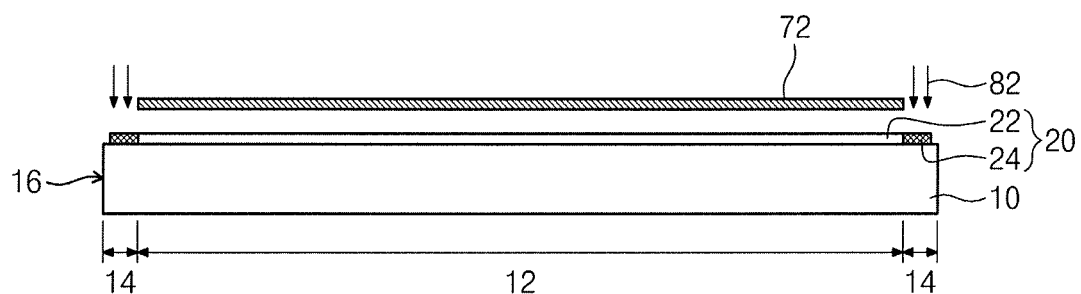

Referring to FIGS. 1 and 5, the photoresist 20 on the edge region 14 of the wafer 10 is exposed to first ultraviolet rays 82 (S140). The active region 12 of the wafer 10 may be shielded from the first ultraviolet rays 82 by a first mask 72. The edge exposure process may be performed on the photoresist 20 disposed on the entire edge region 14. The photoresist 20 on the active region 12 may include a non-exposed photoresist 22. The photoresist 20 on the edge region 14 may include a first exposed photoresist 24 exposed to the first ultraviolet rays 82. The first ultraviolet rays 82 may be provided by, for example, a high pressure mercury lamp. The first ultraviolet rays 82 may be selectively irradiated to the edge region 14 of the wafer 12 via a slit of an edge exposure system. The first ultraviolet rays 82 may include, for example, one of KrF rays having a wavelength of about 248 nm, i-line rays having a wavelength of about 365 nm, and g-line rays having a wavelength of about 436 nm. A length of the edge region 14 extending inward from the outermost portion of the wafer 10 may be about 1.5 mm.

Figure 6:
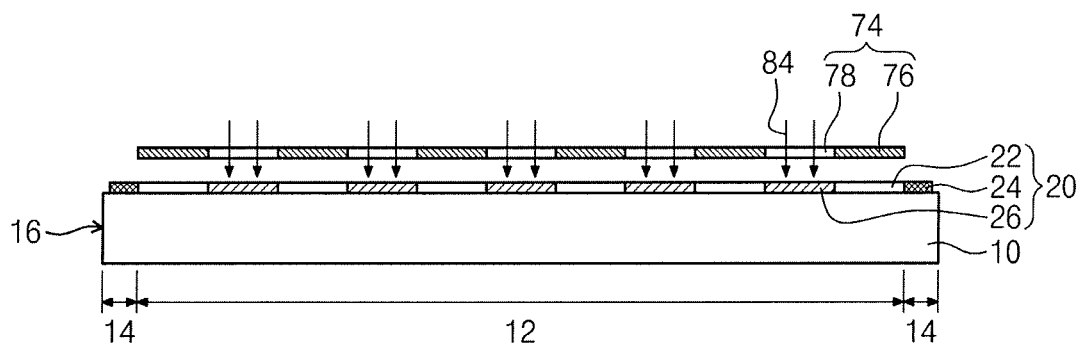

Referring to FIGS. 1 and 6, the photoresist 20 on the active region 12 of the wafer 10 is exposed to second ultraviolet rays 84 (S150), and is then hardened by a post exposed bake (PEB) process (S160). The second ultraviolet rays 84 may include, for example, g-line rays having a wavelength of about 436 nm, i-line rays having a wavelength of about 365 nm, KrF rays having a wavelength of about 248 nm, ArF rays having a wavelength of about 193 nm, or EUV rays having a wavelength between about 10 nm and about 200 nm. A second mask 74 may include shield patterns 76 shielding the second ultraviolet rays 84, and transmission patterns 78 transmitting the second ultraviolet rays 84. Sizes of the shield patterns 76 and the transmission patterns 78 may be substantially equal to or greater than sizes of real patterns formed on the wafer 10. The photoresist 20 of the active region 12 may include a non-exposed photoresist 22 that does not react to the second ultraviolet rays 84, and a second exposed photoresist 26 that reacts to the second ultraviolet rays 84. For example, the sizes of the shield patterns 76 and the transmission patterns 78 may be about four times as large as the sizes of real patterns or patterns of the second exposed photoresist 26 formed on the wafer 10 in a projection exposure system.

The first exposed photoresist 24 on the edge region 14 may also be exposed to the second ultraviolet rays 84 during the pattern exposure process performed on the photoresist 20 on the active region 12. The photoresist 20 may be heated at a temperature of about 110 degrees Celsius in the post exposed bake (PEB) process.

Figure 7:
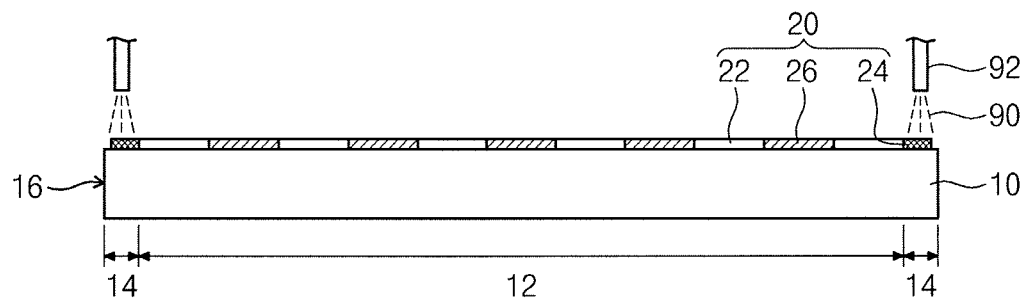
Figure 8:
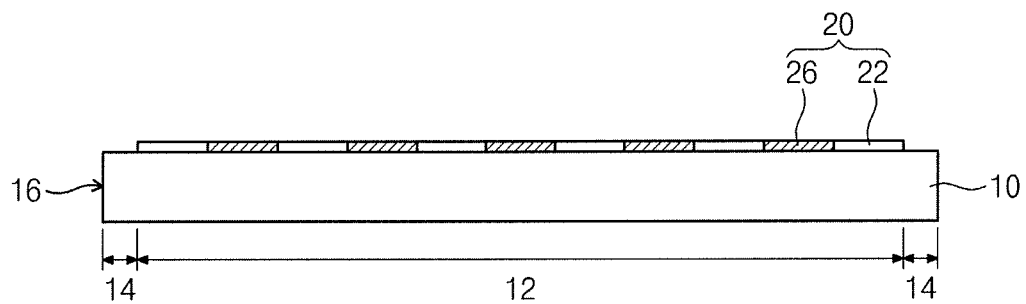

Referring to FIGS. 1, 7, and 8, the first exposed photoresist 24 on the edge region 14 is removed by the positive tone development process (S170). The first exposed photoresist 24 may be removed using a first developing solution. The first developing solution may be, for example, an alkali solution 90 having a hydrogen ion concentration greater than about 7 pH. The alkali solution 90 may include, for example, tetramethylammonium hydroxide (TMAH). The alkali solution 90 may include, for example, an aqueous solution having TMAH of about 2.38%. The alkali solution 90 may be selectively sprayed from a nozzle 92 onto the first exposed photoresist 24. The positive tone development process may be locally performed on the edge region 14 to which the alkali solution is sprayed. For example, the positive tone development process may remove the photoresist 20 in the edge region 14 with a tolerance of about ±0.1 mm with respect to an interface between the edge region 14 and the active region 12. The alkali solution 90 may remove the first exposed photoresist 24 of the edge region 14, and leave the non-exposed photoresist 22 of the active region 12. For example, the removal rate of the first exposed photoresist 24 by the alkali solution 90 may be greater than the removal rate of the non-exposed photoresist 22 by the alkali solution 90.

When a photoresist on an edge region of a wafer is removed by a thinner, the photoresist may be removed with a tolerance of about ±0.2 mm with respect to an interface between the edge region and an active region of the wafer. The thinner may remove all of a non-exposed photoresist and an exposed photoresist, rather than selectivity removing portions of the non-exposed photoresist and exposed photoresist. The thinner may remove the photoresist depending on a spray region of a nozzle. Additionally, the thinner may have a high permeation characteristic, and may substantially permeate into the photoresist. As a result, the amount of the thinner sprayed from the nozzle may be limited to a specific amount. In exemplary embodiments of the inventive concept, the alkali solution 90 may have a lower permeation characteristic than the thinner, and may allow for more alkali solution 90 to be sprayed from the nozzle 92 compared to the thinner.

Since the alkali solution 90 may selectively dissolve the first exposed photoresist 24, the photoresist 20 on the edge region 14 may be cleanly removed. The alkali solution 90 may not react with the non-exposed photoresist 22 on the active region 12. For example, the alkali solution 90 may selectively remove the first exposed photoresist 24 on the edge region 14 without removing the non-exposed photoresist 22 on the active region 12, and the positive tone development process may be selectively performed on the photoresist 20 on the edge region 14. Thus, utilization of the positive tone development process may prevent or reduce residual defects of the photoresist 20 in the edge region 14.

Figure 9:
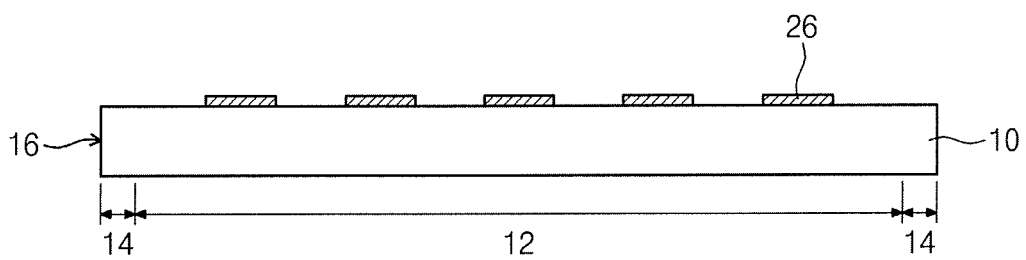

Referring to FIGS. 1 and 9, the non-exposed photoresist 22 on the active region 12 is removed by the negative tone development process (S180), and the second exposed photoresist 26 is then heated by a hard bake process (S190). The photoresist 20 on the active region 12 may be developed using a second development solution. The second development solution may be, for example, an organic acid solution. The organic acid solution may include, for example, normal butyl acetylene. The second developing solution removes the non-exposed photoresist 22. The wafer 10 may soak in the organic acid solution, and the non-exposed photoresist 22 may be dissolved in the organic acid solution. The second exposed photoresist 26 may not react to the organic acid solution, and may remain on the wafer 10. The organic acid solution remaining on the wafer may be removed by the hard bake process. The hard bake process may evaporate the organic acid solution permeated into the second exposed photoresist 26, and the second exposed photoresist 26 may be hardened. For example, the second exposed photoresist 26 may be heated at a temperature within a range of about 130 degrees Celsius to about 140 degrees Celsius. Since the positive tone development process is performed before the negative tone development process is performed in an exemplary embodiment, residual defects of the photoresist 20 in the edge region 14 may be prevented or reduced.

Figure 10:
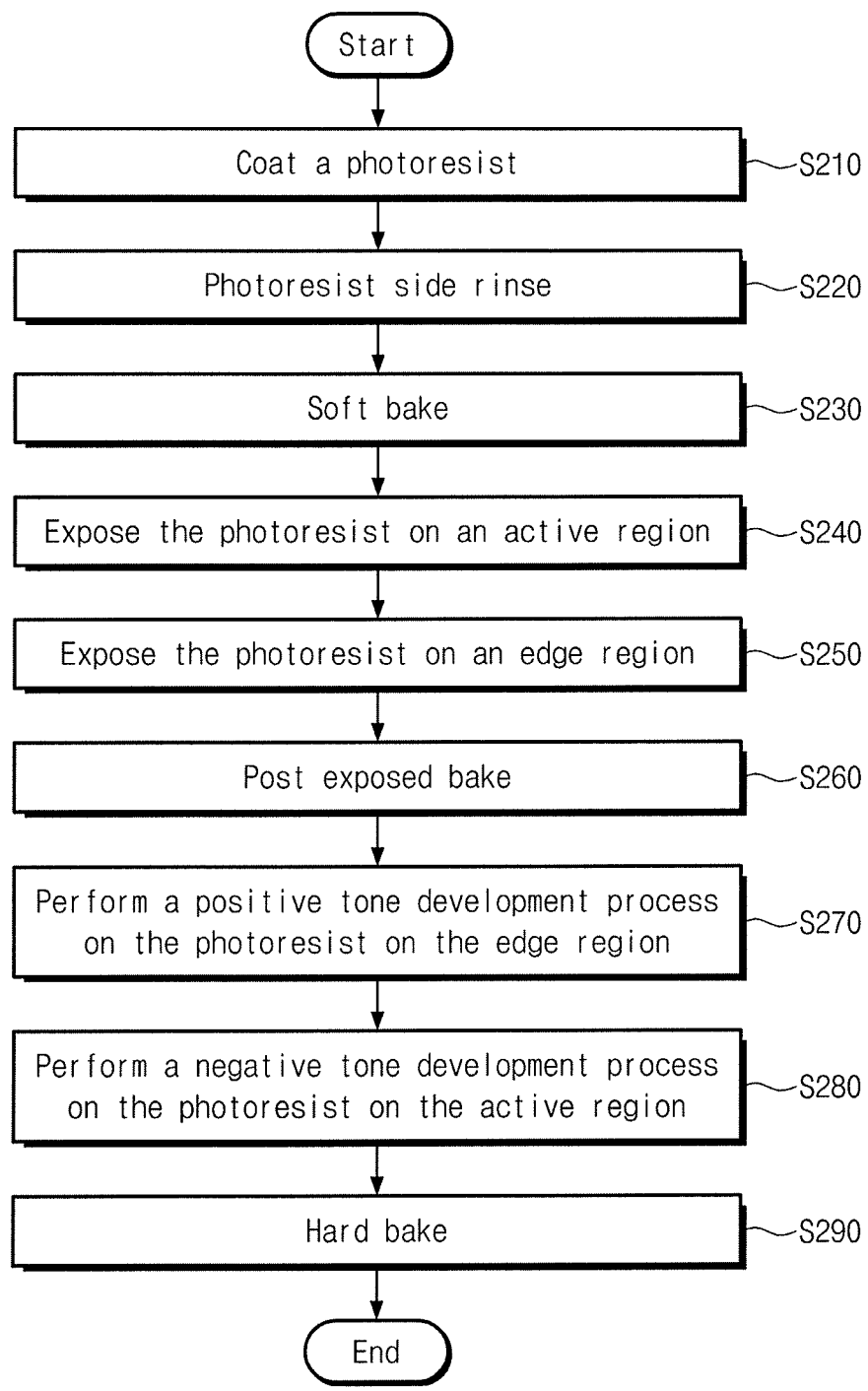
FIG. 10 is a flowchart illustrating a photolithography method, according to an exemplary embodiment of the inventive concept.

FIG. 10 is a flowchart illustrating a photolithography method, according to an exemplary embodiment of the inventive concept.

Referring to FIGS. 2 and 10, the pattern exposure process performed on the photoresist 20 on the active region 12 may be performed before the edge exposure process performed on the photoresist 20 on the edge region 14 is performed. Thus, as shown in FIG. 10, in an exemplary embodiment of the inventive concept, the order of the pattern exposure process and the edge exposure process may be changed with each other.

Figure 11:
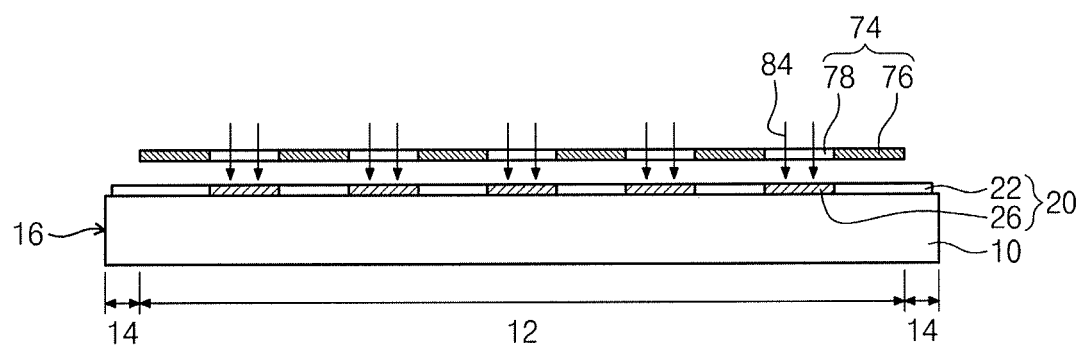
FIGS. 11 and 12 are cross-sectional views sequentially illustrating a photolithography method of FIG. 10, according to an exemplary embodiment of the inventive concept.
Figure 12:
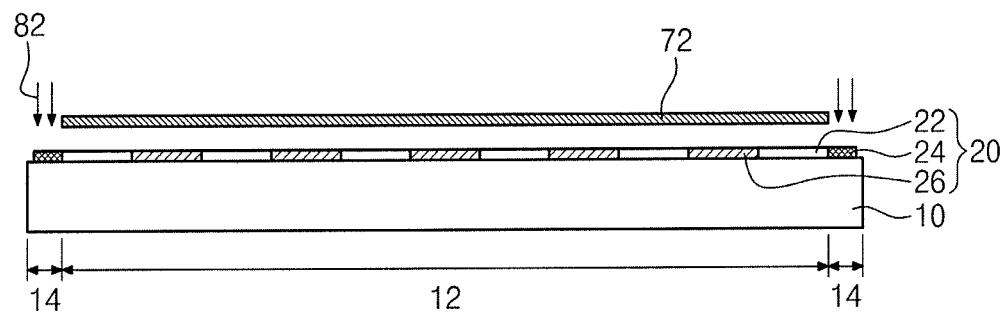

FIGS. 11 and 12 are cross-sectional views sequentially illustrating a photolithography method of FIG. 10, according to an exemplary embodiment of the inventive concept.

Referring to FIGS. 3, 4 and 10, the photoresist 20 may be coated on the wafer 10 (S210), the photoresist on the side 16 of the wafer 10 may be removed by the side rinse process (S220), and the photoresist 20 may be hardened by the soft bake process (S230).

Referring to FIGS. 10 and 11, the photoresist 20 on the active region 12 may be exposed to the second ultraviolet rays 84 (S240). The photoresist 20 on the active region 12 may be partially exposed to the second ultraviolet rays 84 transmitted through the transmission patterns 78 of the second mask 74. The photoresist 20 on the active region 12 may include the non-exposed photoresist 22 and the second exposed photoresist 26. At this time, the photoresist 20 on the edge region 14 may include a non-exposed photoresist.

Referring to FIGS. 10 and 12, the photoresist 20 on the edge region 14 may be exposed to the first ultraviolet rays 82 (S250), and the photoresist 20 may then be heated by the post exposed bake process (S260). The photoresist 20 on the edge region 14 may include the first exposed photoresist 24.

Referring to FIGS. 7 to 10, the photoresist 20 on the edge region 14 may be removed by the positive tone development process (S270), and the photoresist 20 on the active region 12 may then be patterned by the negative tone development process (S280). The positive tone development process may selectively remove the first exposed photoresist 24 on the edge region 14. The first exposed photoresist 24 may be removed by the alkali solution 90. The negative tone development process may remove the non-exposed photoresist 22 on the active region 12. At this time, the photoresist 20 may soak in the organic acid solution. The second exposed photoresist 26 may then be hardened by the hard bake process (S290).

Figure 13:
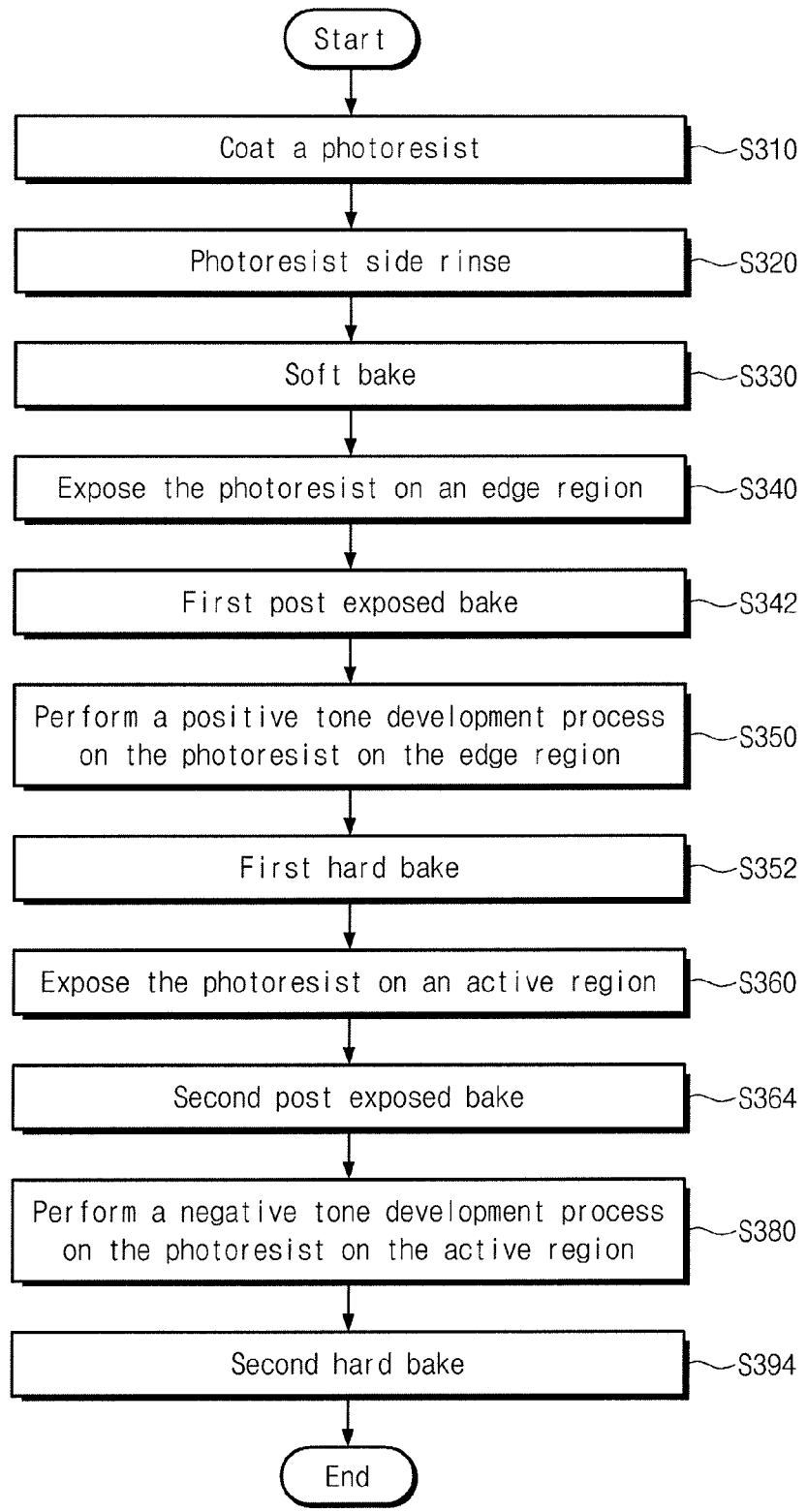
FIG. 13 is a flowchart illustrating a photolithography method, according to an exemplary embodiment of the inventive concept.

FIG. 13 is a flowchart illustrating a photolithography method, according to an exemplary embodiment of the inventive concept.

Referring to FIGS. 3 to 9 and 13, the photoresist 20 on the edge region 14 may be removed before the photoresist 20 on the active region 12 is exposed. The photoresist 20 on the edge region 14 may be removed by the edge exposure process and the positive tone development process (S340 and S350). The photoresist 20 on the active region 12 may then be patterned by the pattern exposure process and the negative tone development process (S360 and S380).

Thus, in the photolithography method according to the exemplary embodiment described with reference to FIG. 13, the photoresist 20 on the edge region 14 may first be removed (S350). Subsequently, the photoresist 20 on the active region 12 may be exposed to the second ultraviolet rays 84 and may then be patterned (S360 and S380).

Figure 14:
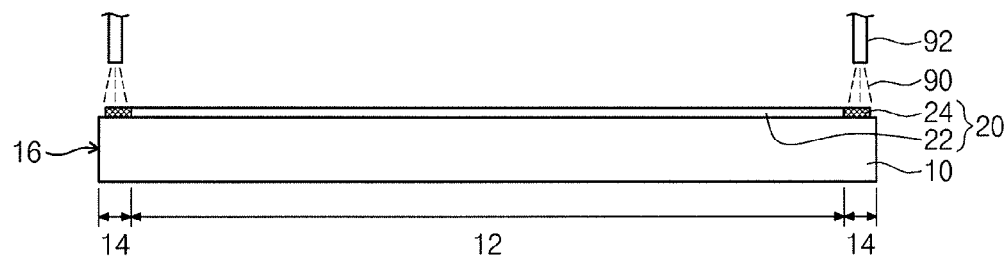
FIGS. 14 to 16 are cross-sectional views sequentially illustrating a photolithography method of FIG. 13, according to an exemplary embodiment of the inventive concept.
Figure 15:
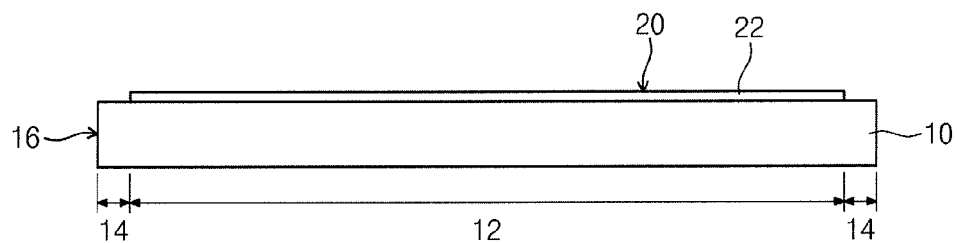
Figure 16:
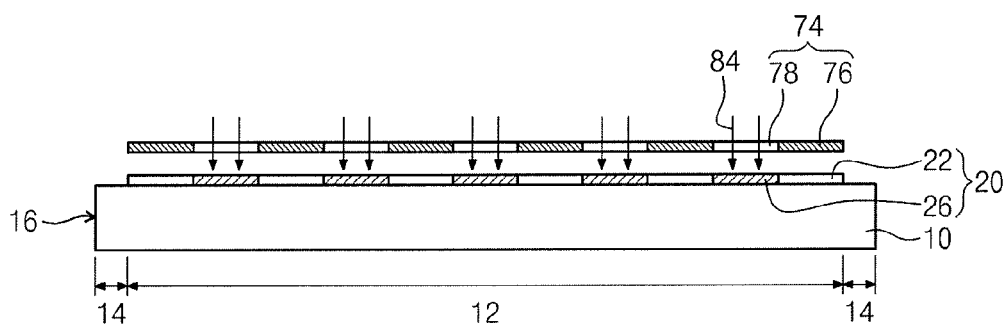

FIGS. 14 to 16 are cross-sectional views sequentially illustrating a photolithography method of FIG. 13, according to an exemplary embodiment of the inventive concept.

Referring to FIGS. 3, 4, and 13, the photoresist 20 may be coated on the wafer 10 using a spin coating method (S310), and then the photoresist 20 on the side 16 of the wafer 10 may be removed using a side rinse process (S320). Subsequently, the photoresist 20 may be soft-baked (S330).

Referring to FIGS. 5 and 13, the photoresist 20 on the edge region 14 may be exposed to the first ultraviolet rays 82 (S340), and may then be hardened by a first post exposed bake process (S342). The photoresist 20 on the edge region 14 may include the first exposed photoresist 24. The photoresist 20 on the active region 12 may include the non-exposed photoresist 22.

Referring to FIGS. 13 and 15, the first exposed photoresist 24 on the edge region 14 may be removed using the positive tone development process (S350). The alkali solution 90 may remove the first exposed photoresist 24 on the edge region 14, and may have removal selectivity with respect to the non-exposed photoresist 22 on the active region 14. The photoresist 20 on the active region 12 may be hardened by a first hard bake process (S352). The hard bake process may be performed with a temperature within a range of about 110 degrees Celsius to about 120 degrees Celsius.

Thus, as shown in FIG. 13, the lithography method according to an exemplary embodiment may first remove the photoresist 20 on the edge region 14 using the edge exposure process and the positive tone development process before the photoresist 20 on the active region 12 is removed.

Referring to FIGS. 13 and 16, the photoresist 20 on the active region 12 may be exposed to the second ultraviolet rays 84 transmitted through the second mask 74 (S360), and the photoresist 20 may then be hardened by a second post exposed bake process (S364). The photoresist 20 on the active region 12 may include the non-exposed photoresist 22 and the second exposed photoresist 26. In an exemplary embodiment, at least one of the first hard bake process and the second post exposed bake process may be omitted.

Referring to FIGS. 9 and 13, the photoresist 20 on the active region 12 may be patterned by the negative tone development process (S380). The photoresist 20 on the active region 12 may soak in the second developing solution. The non-exposed photoresist 22 may be removed by the second developing solution. The second exposed photoresist 26 remaining on the wafer 10 may be hardened by a second hard bake process (S394).

Thus, as shown in FIG. 13, the photolithography method according to an exemplary embodiment may remove the photoresist 20 on the edge region 14, and may then pattern the photoresist 20 on the active region 12.

As a result, the photolithography method including the dual development process according to exemplary embodiments of the inventive concept may increase production yield.

As described above, according to exemplary embodiments of the inventive concept, a positive tone development process may be used to remove photoresist on the edge region of a wafer, and a negative tone development process may be used to develop photoresist on an active region of a wafer. The positive tone development process may be performed prior to the negative tone development process. Utilization of the positive tone development process may prevent or reduce residual defects of the photoresist on the edge region.

While the inventive concept has been described with reference to exemplary embodiments, it will be apparent to those skilled in the art that various changes and modifications may be made without departing from the spirit and scope of the inventive concept as defined by the following claims.

What is claimed is:

1. A photolithography method, comprising:
coating a photoresist on an active region and an edge region of a wafer;
exposing the photoresist on the edge region to first ultraviolet rays;
exposing the photoresist on the active region to second ultraviolet rays;
depositing a first developing solution on the photoresist on the edge region to remove the photoresist on the edge region using a positive tone development process; and
depositing a second developing solution on the photoresist on the active region to develop a first portion of the photoresist on the active region using a negative tone development process, wherein a second portion of the photoresist on the active region remains on the active region.

2. The photolithography method of claim 1, wherein the photoresist comprises a chemical amplification type photoresist.

3. The photolithography method of claim 2, wherein the chemical amplification type photoresist comprises a positive photoresist.

4. The photolithography method of claim 1, wherein depositing the first developing solution comprises spraying the first developing solution on the photoresist on the edge region.

5. The photolithography method of claim 1, wherein the first developing solution comprises an alkali solution.

6. The photolithography method of claim 5, wherein the alkali solution comprises an aqueous solution having a tetramethylammonium hydroxide (TMAH).

7. The photolithography method of claim 1, wherein developing the first portion of the photoresist on the active region comprises soaking the wafer in the second developing solution.

8. The photolithography method of claim 1, wherein the second developing solution comprises an organic acid solution.

9. The photolithography method of claim 8, wherein the organic acid solution comprises normal butyl acetylene.

10. The photolithography method of claim 1, further comprising:
removing the photoresist on a side of the wafer before exposing the photoresist on the edge region.

11. The photolithography method of claim 1, further comprising:
performing a post exposed bake process on the photoresist on the edge region and the active region after exposing the photoresist on the edge region and the active region.

12. The photolithography method of claim 1, wherein exposing the photoresist on the active region is performed after exposing the photoresist on the edge region.

13. The photolithography method of claim 12, further comprising:
performing a hard bake process or a post exposed bake process on the photoresist.

14. The photolithography method of claim 1, wherein a length of the edge region extending inward from an outermost portion of the wafer is about 1.5 mm.

15. A photolithography method, comprising:
coating a photoresist on an active region and an edge region of a wafer;
exposing the photoresist on the edge region to first ultraviolet rays;
exposing the photoresist on the active region to second ultraviolet rays;
depositing a first developing solution on the photoresist on the edge region to remove the photoresist on the edge region; and
developing the photoresist on the active region using a second developing solution,
wherein exposing the photoresist on the edge region is performed after exposing the photoresist on the active region.

16. A photolithography method, comprising:
coating a photoresist on an active region and an edge region of a wafer;
exposing the photoresist on the edge region to first ultraviolet rays;
performing a positive tone development process on the photoresist on the edge region;
exposing the photoresist on the active region to second ultraviolet rays; and
performing a negative tone development process on the photoresist on the active region.

17. The photolithography method of claim 16, further comprising:
performing a first post exposed bake process on the photoresist on the edge region after exposing the photoresist on the edge region and before performing the positive tone development process; and
performing a second post exposed bake process on the photoresist on the active region after exposing the photoresist on the active region and before performing the negative tone development process.

18. The photolithography method of claim 17, further comprising:
performing a first hard bake process on the photoresist on the active region after performing the positive tone development process and before exposing the photoresist on the active region; and
performing a second hard bake process on the photoresist on the active region after performing the negative tone development process.

19. The photolithography method of claim 16, wherein exposing the photoresist on the edge region is performed before exposing the photoresist on the active region.

20. A photolithography method, comprising:
coating a photoresist on an active region and an edge region of a wafer;
exposing the photoresist on the edge region to first ultraviolet rays;
performing a positive tone development process on the photoresist on the edge region;
exposing the photoresist on the active region to second ultraviolet rays; and
performing a negative tone development process on the photoresist on the active region,
wherein exposing the photoresist on the active region is performed before exposing the photoresist on the edge region.

\* \* \* \* \*